United States Patent [19]

Jambotkar

[11] 4,319,932

[45] Mar. 16, 1982

[54] METHOD OF MAKING HIGH PERFORMANCE BIPOLAR TRANSISTOR WITH POLYSILICON BASE CONTACTS

[75] Inventor: Chakrapani G. Jambotkar, Hopewell Junction, N.Y.

[73] Assignee: International Business Machines Corporation, Armonk, N.Y.

[21] Appl. No.: 133,156

[22] Filed: Mar. 24, 1980

[51] Int. Cl.³ .................... B01J 17/00; H01L 21/265
[52] U.S. Cl. ........................... 148/1.5; 29/571; 148/187; 357/34; 357/59; 357/91
[58] Field of Search ............... 148/1.5, 187; 29/571; 357/34, 59, 91

[56] References Cited

U.S. PATENT DOCUMENTS

| | | | |
|---|---|---|---|
| 3,904,450 | 9/1975 | Evans et al. | 148/175 |
| 4,103,415 | 8/1978 | Hayes | 29/571 |
| 4,109,273 | 8/1978 | Glasl et al. | 357/35 |
| 4,151,009 | 4/1979 | Ogureck et al. | 148/1.5 |
| 4,157,269 | 6/1979 | Ning et al. | 148/1.5 |
| 4,160,991 | 7/1979 | Anantha et al. | 357/49 |
| 4,188,707 | 2/1980 | Asano et al. | 29/571 |
| 4,190,466 | 2/1980 | Bhattacharya et al. | 148/1.5 |
| 4,209,350 | 6/1980 | Ho et al. | 148/188 |
| 4,234,362 | 11/1980 | Riseman | 148/187 |
| 4,242,791 | 1/1981 | Horng et al. | 29/578 |

FOREIGN PATENT DOCUMENTS 2818090 11/1978 Fed. Rep. of Germany.

OTHER PUBLICATIONS

R. D. Isaac et al., "Method for Fabricating a Self-Aligned Vertical PNP Transistor", IBM Technical Disclosure Bulletin, vol. 22, No. 8A, Jan. 1980, pp. 3394-3396.
T. H. Ning et al., "Bipolar Transistor Structure", IBM Technical Disclosure Bulletin, vol. 21, No. 2, Jul. 1978, pp. 846-849.
T. H. Yeh, "Self-Aligned Integrated NPN (Vertical) and PNP (Lateral) Structures" IBM Technical Disclosure Bulletin, vol. 22, No. 9, Feb. 1980, pp. 4047-4051.
Ho et al., "Stacking Poly-Silicon Devices for High Density LSI", IBM Technical Disclosure Bulletin, vol. 21, No. 12, May 1979, pp. 4843, 4844.
C. G. Jambotkar, "Method for Reducing the Emitter--Base Contact...", IBM Technical Disclosure Bulletin, vol. 19, No. 12, May 1977, 4601ff.
K. Okada et al., "A New Polysilicon Process for a Bipolar Device-PSA Technology", IEEE Transactions on Electron Devices, vol. ED-26, No. 4, Apr. 1979, pp. 385-389.

*Primary Examiner*—Upendra Roy
*Attorney, Agent, or Firm*—John A. Jordan

[57] ABSTRACT

Bipolar transistor devices are formed by employing polysilicon base contacts self-aligned with respect to a diffusion or ion implantation window used to form emitter, intrinsic base and raised subcollector regions. The polysilicon acts as a self-aligned impurity source to form the extrinsic base region therebelow and, after being coated with silicon dioxide on its surface and along the sidewalls of the diffusion or ion implantation window, as a mask. Directional reactive ion etching is used to form a window in the silicon dioxide while retaining it along the sidewalls. Ion implantation, for example, may be used to form, through the window, an emitter, intrinsic base and raised subcollector region. The silicon dioxide is used as an insulator to separate the emitter contact from polysilicon.

26 Claims, 15 Drawing Figures

METHOD OF MAKING HIGH PERFORMANCE BIPOLAR TRANSISTOR WITH POLYSILICON BASE CONTACTS

BACKGROUND OF THE INVENTION

Field of the Invention

The present invention relates to bipolar transistor fabrication methods and devices and, more particularly, to bipolar transistor fabrication methods and devices employing doped polysilicon base contacts formed close to emitter openings in a self-aligned manner.

CROSS REFERENCE TO RELATED APPLICATIONS

U.S. patent application Ser. No. 098,588 entitled "A Self-Aligned Micrometer Bipolar Transistor Device and Process" filed Nov. 29, 1979 by C. T. Horng et al, and assigned to the assignee of this application.

U.S. patent application Ser. No. 133,155 entitled "A Polysilicon-Base Self-Aligned Bipolar Transistor Process and Structure" filed the same date as this application by Ho et al, and assigned to the assignee of this application.

U.S. patent application Ser. No. 79/01137 (filed as an international application) entitled "Method for Achieving Ideal Impurity Base Profile in a Transistor" filed Dec. 28, 1979 by B. L. Crowder et al, and assigned to the assignee of this application.

DESCRIPTION OF THE PROBLEM AND PRIOR ART

In order to increase the performance of bipolar devices, extensive efforts have been made to develop fabrication processes which will result in smaller devices, spaced as closely as possible. Increased device density improves switching speed characteristics as well as wafer productivity.

In bipolar devices, improvement in switching speed characteristics is sought, at least in part, by effecting a reduction in the base resistance, base-collector junction capacitance and collector-substrate capacitance. Efforts to reduce these parameters through reduction in device size have been confronted with a number of problems. In this regard, conventional photolithographic capability requires considerable allowance for registration (i.e., alignment) and etch tolerances. In addition, conventional processes employ a multiplicity of complex steps, each involving a discrete alignment requirement. The multiplicity of discrete steps requiring alignment compounds the problem by increasing the probability of defects and errors. Therefore, in order to minimize defects and errors, ground rules fashioned from tolerance constraints must be imposed upon fabrication processes; these constraints impede efforts to reduce size.

One technique employed in the prior art to reduce size and improve device yield is the so called "self-alignment technique." In the absence of such a technique, misalignment of, for example, the emitter region with respect to the base contact can result in variations in the extrinsic base resistance. In addition, this misalignment can also result in a higher $V_{BE}$ at one emitter edge than at the other. Thus, self-alignment not only aids in reduction of device size but also in improving device characteristics, reliability and yield.

Typical of the prior art schemes using self-alignment is that described by Ho et al in their article entitled "Stacking Poly-Silicon Devices for High Density LSI", published May 1979 in Vol. 21, No. 12 of the IBM Technical Disclosure Bulletin. Ho et al describe a bipolar process wherein polysilicon base contacts are used to self-align a polysilicon emitter contact, the latter being used as a source of impurity to form the emitter region. The polysilicon base and emitter contacts in Ho et al are separated by an oxide layer.

Likewise, U.S. Pat. No. 4,157,269 to Ning et al describes the use of self-aligning polysilicon base contacts separated from the emitter contact by an oxide layer. However, the Ning et al process of forming the oxide sidewalls relies upon multiple masking layers and etching steps and undercutting techniques using wet etching.

An article entitled "Method for Reducing the Emitter-Base Contact Distance in Bipolar Transistors" by C. G. Jambotkar appearing in Vol. 19, No. 12, May, 1977, of the IBM Technical Disclosure Bulletin describes two processes for reducing emitter-base contact distance using horizontal layers of insulation for separation therebetween and polysilicon as either base or emitter contact. However, because conventional process techniques are employed by Jambotkar to form insulation between emitter and base contact, the ability to achieve close spacing is limited. In similar manner, U.S. Pat. No. 4,160,991 to Anantha et al describes another arrangement aimed at reducing the spacing between emitter and polysilicon base contacts.

The use of polysilicon base contacts self-aligned to the emitter contact of a bipolar transistor has also been taught in an article entitled "A New Polysilicon Process for a Bipolar Device-PSA Technology" appearing in the *IEEE Trans-actions on Electron Devices*, Vol. ED-26, No. 4, April, 1979. Although this article is directed to a polysilicon self-aligned (PSA) method, the method does not achieve close attainable spacing utilizing self-aligned vertical walls of an insulating material.

Further reference is made to U.S. Pat. No. 3,904,450 entitled "Method of Fabricating Injection Logic Integrated Circuits Using Oxide Isolation" granted Sept. 9, 1975 to W. J. Evans et al. The Evans et al patent discloses an integrated injection logic cell structure and its fabrication. A pattern of oxide isolation regions is used to define, at least partially, the introduction of two types of impurities in a manner as to reduce the number of required masking steps. A pattern of polycrystalline silicon containing impurities is used both as a diffusion source and an interconnection.

Finally, reference is made to U.S. Pat. No. 4,103,415 entitled "Insulated-Gate Field-Effect Transistor with Self-Aligned Contact Hole to Source or Drain" granted Aug. 1, 1978 to J. A. Hayes. The Hayes patent is directed to an arrangement employing an oxide dielectric layer interposed between the polysilicon gate and the contact hole to the source or drain of an insulated-gate field-effect transistor. The oxide dielectric layer enables the contact hole to be close to the polysilicon gate without electrical shorts occurring therebetween, thereby eliminating the need for a minimum separation between gate and contact hole.

SUMMARY OF THE INVENTION

In accordance with the principles of the present invention, improved bipolar devices and methods for fabricating the same are provided by employing polysilicon base contacts self-aligned with respect to a diffusion or ion implantation window used to form as many as three distinct regions in the underlying substrate. The polysilicon is used as an impurity source to form the extrinsic base region therebelow. In addition, the polysilicon, coated with a layer of silicon dioxide insulating material over its surface and on the sidewalls of the window formed therein, acts as a self-aligned diffusion or ion implantation mask. Directional reactive ion etching is used to form a window in the layer of insulating material leaving sidewall insulation. Ion implantation, for example, may be used to form, through said window, a raised subcollector region, an intrinsic base region and a shallow emitter region. The sidewall insulation not only delineates a self-aligned window but also subsequently acts as a narrow self-aligned insulating separator between the polysilicon base contact and the emitter contact.

In accordance with such process and resulting devices, high density arrangements may be achieved with good yield and high reliability, exhibiting improved switching speed and $I_E - V_{BE}$ characteristics, lower base resistance, and reduced collector-substrate and collector-base junction capacitances.

It is, therefore, an object of the present invention to provide improved bipolar devices and methods of making same.

It is a further object of the present invention to provide a simplified process of fabricating high density bipolar devices.

It is yet a further object of the present invention to provide bipolar devices and processes for making same which exhibit improved device characteristics, such as switching speed and $I_E - V_{BE}$ characteristics.

It is yet still a further object of the present invention to provide bipolar devices and methods of making same which devices exhibit reduced collector-substrate capacitance and collector-base junction capacitance.

It is another object of the present invention to provide a process for fabricating bipolar devices which is simple and precise, providing good yield, and which results in devices with improved characteristics.

DESCRIPTION OF THE PREFERRED EMBODIMENTS

Figure 1A:
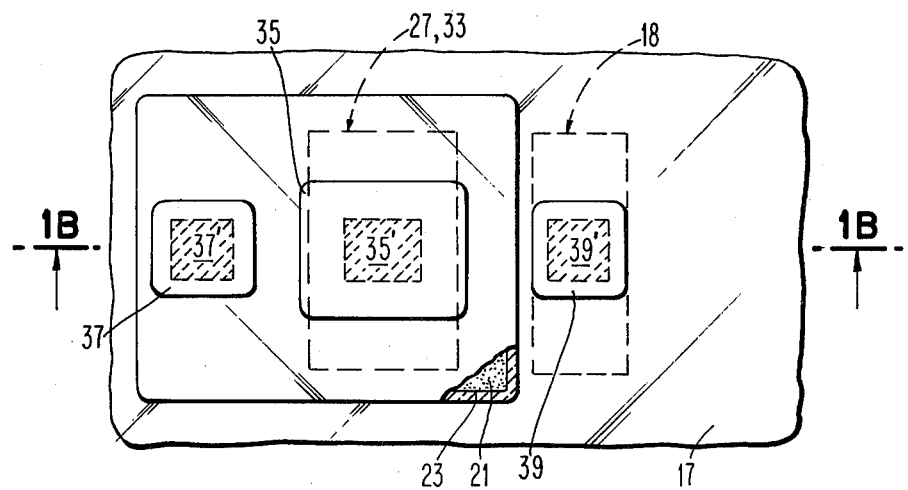
FIG. 1A shows a top view of the bipolar transistor structure fabricated in accordance with the present invention.
Figure 1B:
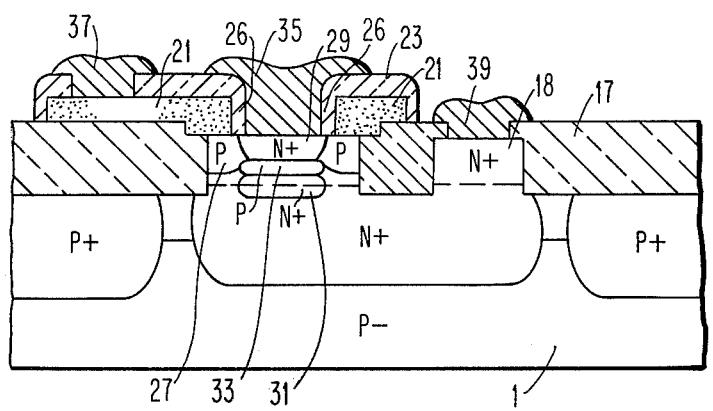
FIG. 1B shows a cross-sectional view taken along the line 1B—1B of FIG. 1A.

The top view and the cross-sectional view of the final bipolar transistor device fabricated in accordance with the principles of the present invention are shown in FIG. 1A and FIG. 1B, respectively. The starting substrate 1 is P$^-$type silicon. Metal 35 makes ohmic connection to emitter region 29, as shown in FIG. 1B, the metal-silicon contact area being shown as 35' in FIG. 1A. Metal 37 makes ohmic connection to polysilicon material 21 at contact area 37' shown in FIG. 1, the polysilicon material making contact to extrinsic base region 27, as shown in FIG. 1B. In similar fashion, metal 39 makes ohmic connection to collector reachthrough region 18 at contact area 39'. As shown in FIG. 1A, recessed oxide region 17 surrounds the device and oxide layers 23 and 26 separate polysilicon 21 from metal 35.

Figure 2:
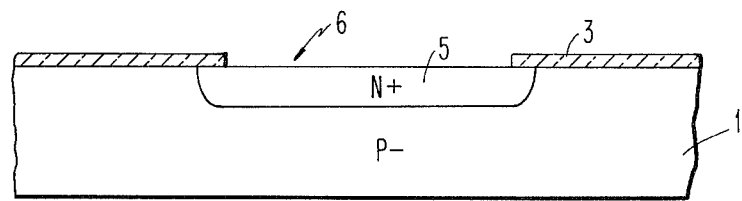
FIGS. 2-13 show cross-sectional view at various steps in the fabrication process employed to make the bipolar transistor structure in accordance with the principles of the present invention.

The manner in which the bipolar transistor device, shown in FIG. 1, is fabricated in accordance with the process of the present invention will now be described with reference to FIGS. 2-14. Referring now more particularly to FIG. 2, the bipolar transistor device is fabricated by starting with wafer or substrate 1 of P$^-$silicon monocrystalline material. The manufacturing process described with reference to FIGS. 2-14 results in an NPN bipolar transistor. It should, however, be evident to those skilled in the art that the conductivity types shown in the drawing are selected for illustrative purposes only, and that opposite conductivity types could, as readily, be employed so as to realize a PNP bipolar transistor. Further, the concentration of impurities may be increased or decreased, as desired, in a manner familiar to those skilled in the art. Typically, substrate 1 may be fabricated by pulling a monocrystalline rod from a suitable melt containing a P-type material, such as boron, and using a seed crystal having a $<100>$ crystallographic orientation. The resulting rod may then be sliced into thin wafers which also have the surface crystallographic orientation of $<100>$. The P$^-$silicon wafer has preferably a resistivity of 10–20 ohm-cm.

Referring again to FIG. 2, region 5 of conductivity opposite to that of substrate 1 is formed therein by conventional diffusion process. However, it is to be understood that other techniques may be employed to form region 5, such as, ion implantation. Region 5 is formed by first, in the case of a silicon substrate, forming an insulating layer 3 of, for example, silicon dioxide on the surface of silicon substrate 1 by thermal oxidation. Typically, the thickness of the silicon dioxide would be 3500Å.

After forming oxide layer 3, a conventional photoresist may be used to coat the surface thereof. Using suitable mask, the photoresist is then exposed in the region corresponding to the window 6 in FIG. 2, and the exposed photoresist is removed subsequently. Thereafter, conventional etching techniques may be employed to form opening or window 6 in silicon dioxide layer 3. The remnant layer of photoresist is then stripped and the device is ready for formation of N+region 5.

The substrate 1 partially covered by silicon dioxide 3 is then positioned in a diffusion furnace and an N+type dopant, for example, arsenic is diffused into the exposed silicon so as to obtain N+region 5, shown in FIG. 2. The N+region 5 may be further extended into substrate 1 by subjecting the substrate to heat, whereby the arsenic may be further driven into the substrate to the desired extent.

Figure 3:
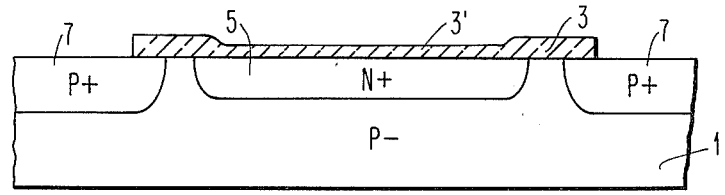

After N+region 5 has been formed, thermal silicon dioxide 3', typically 3500Å thick, is grown over exposed silicon. Silicon dioxide layer 3, left on from the previous step, also becomes simultaneously thicker, as shown in FIG. 3. Portions of the silicon dioxide layer are then selectively removed. This may be accomplished by using conventional photoresist and exposure/etching akin to that described with reference to FIG. 2 and as is well understood by those skilled in the art. Thereafter, substrate 1 is again positioned in a diffusion furnace for introducing a P+type dopant, for example boron, into exposed portions to form subisolation regions 7, shown in FIG. 3. Silicon dioxide layer 3-3' is then removed.

Figure 4:
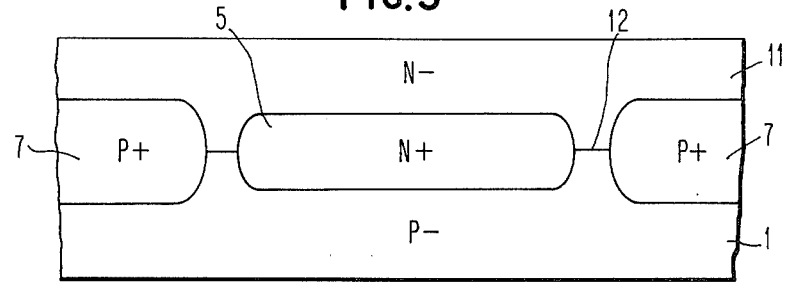

The structure is then placed in an epitaxial growth chamber wherein epitaxial layer 11 is formed, as shown in FIG. 4. Although the epitaxial layer may be any desired thickness, for purposes of the high performance devices of the type involved in the present invention, the thickness should be less than about 2 microns. Typically, the thickness of epitaxial layer 11 is about 1.2 microns. Layer 11 is grown onto substrate 1 by conventional techniques, such as the use of $SiCl_4/H_2$ or $SiH_4/H_2$ mixtures at about 1,000° to 2,000° C. As shown in FIG. 4, during epitaxial growth the N+ and P+ dopants of regions 5 and 7 diffuse upward into the epitaxial layer, line 12 representing the original silicon surface where epitaxial growth commenced.

Figure 5:
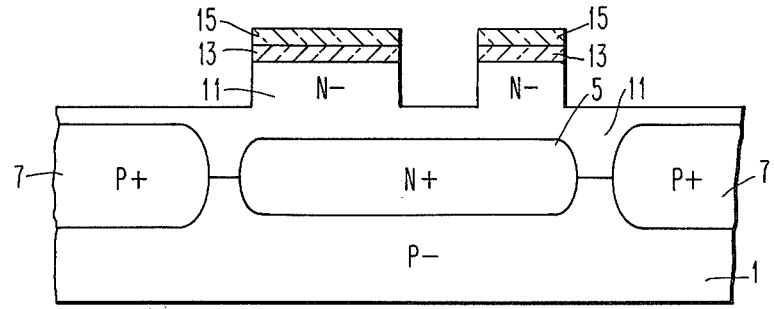

After formation of epitaxial layer 11, a layer of silicon dioxide is formed over the epitaxial layer. A portion of this layer is shown at 13 in FIG. 5. A layer of silicon nitride 15 is then formed over the layer of silicon dioxide and conventional photolithography and etching techniques are employed to selectively remove silicon nitride and silicon dioxide. With openings formed in the layers of silicon nitride and silicon dioxide, N−epitaxial layer 11 is etched to form the trenches over P+ regions 7 and N+ region 5, as shown in FIG. 5.

Figure 6:
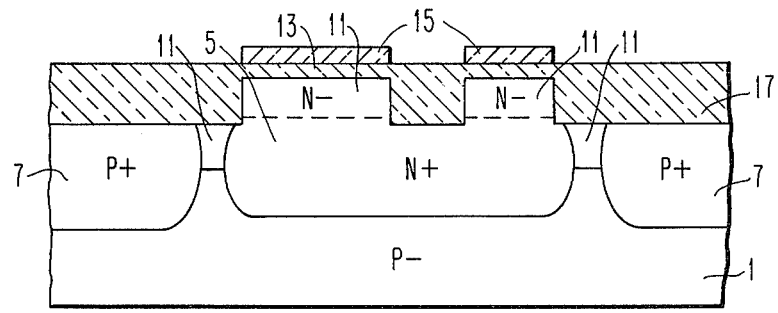
Figure 7:
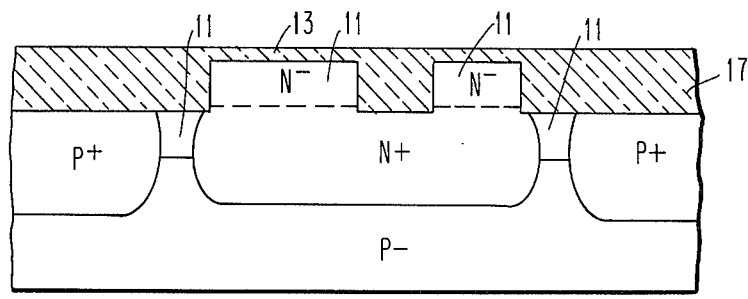

After forming the trenches in epitaxial layer 11, oxide layer 17 is thermally grown thereon, as shown in FIG. 6, to a level corresponding approximately to the top surface of oxide layer 13. During thermal growth of oxide layer 17, further upward diffusion of the dopants from P+ region 7 and N+ region 5 occurs. After forming oxide layer 17 to the top of oxide layer 13, silicon nitride layer 15 is removed, as shown in FIG. 7.

Figure 8:
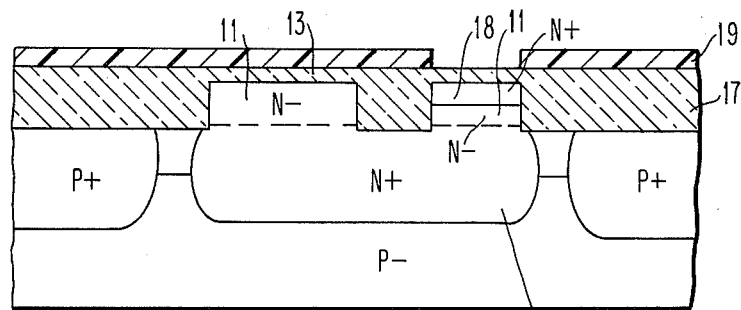

After recessed oxide layer 17 is formed, N+ collector reach-through region 18, as shown in FIG. 8, is formed in a manner familiar to those skilled in the art. More particularly, a layer of photoresist 19 is deposited on the oxide layer 17. The photoresist layer is exposed and developed to form an opening, as shown in FIG. 8. A suitable N+-type impurity, such as phosphorus, is then ion implanted through the opening to form N+ reach-through region 18. The remnant resist layer 19 is then removed.

Figure 9:
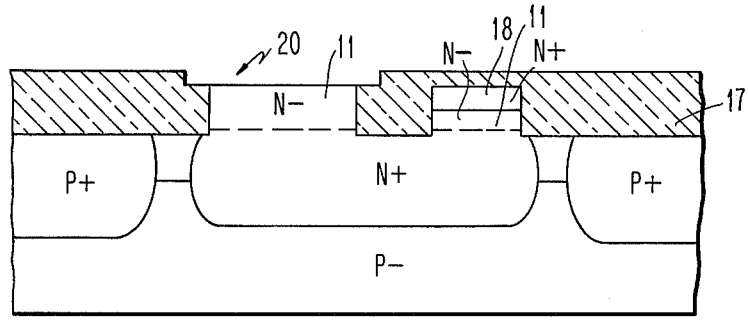

The portion 13 of the oxide layer over N−region 11, preferably extended slightly on each side of the exposed surface of latter, is thereafter removed, as shown at 20 in FIG. 9. This may be achieved by using conventional photolithography and etching techniques. In this regard, after forming the mask window or opening in a photoresist layer, either wet etching or reactive ion etching may be employed to form opening 20.

Figure 10:
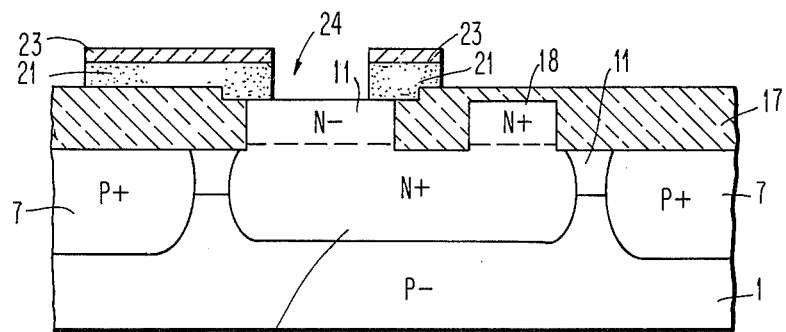
Figure 11:
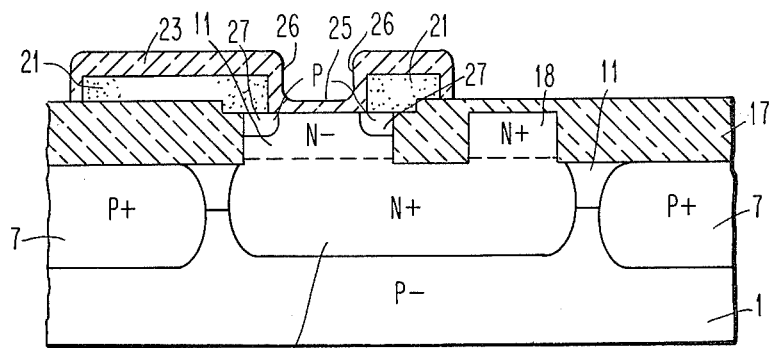

A layer 21 of P-doped polysilicon material is then deposited upon the structure, as shown in FIG. 10. Typically, the layer of polysilicon material would be approximately 8,000Å thick. The doping of the polysilicon material may be accomplished either during deposition or, using ion implantation, after deposition as familiar to those skilled in the art. In this regard, implantation of P-dopant into a thin top layer of the underlying N−epitaxial region 11 is inconsequential. After forming polysilicon layer 21, a pyrolytic silicon dioxide layer 23 is formed over the polysilicon. The silicon dioxide layer is typically between 5,000 and 6,000Å thick.

Through conventional photolithography and etching techniques, portions of silicon dioxide layer 23, as shown in FIG. 10, are selectively removed. The preferred mode of removing the silicon dioxide is through reactive ion etching. After selectively removing portions of the silicon dioxide, the underlying exposed polysilicon is etched to the surface of N−epitaxial layer 11, thereby forming window or opening 24, as shown in FIG. 10. Again, the preferred mode of etching the polysilicon is reactive ion etching. In this regard, termination of the polysilicon etching with a minimum etching of the underlying N−epitaxial layer 11 is desirable. However, tight control over polysilicon etching is not critical in that etching a few hundred angstroms of the N−epitaxial surface or, alternatively, leaving a few hundred angstroms residual polysilicon over the N−epitaxial surface is of little consequence.

After opening 24 has been formed, a continuous layer of silicon dioxide is thermally grown over N−epitaxial region 11 at the bottom of the opening and over the vertical surface of the exposed polysilicon along the walls of the opening. This layer is shown at 25 and 26 in FIG. 11 and, typically, is grown to 0.2–0.4 micrometers thick. Some thermal growth also occurs at silicon dioxide layer 23 to slightly thicken this layer. During the heat cycle employed for this silicon dioxide thermal growth, the P-dopant material in polysilicon layer 21 diffuses into the underlying portions of N−epitaxial layer 11, as shown at 27 in FIG. 11. Thus, simultaneous with the formation of oxide sidewalls 26 is the formation of extrinsic base region 27.

Figure 12:
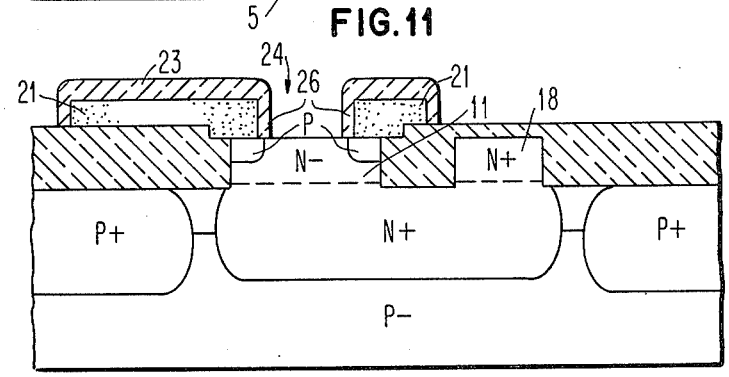
Figure 13:
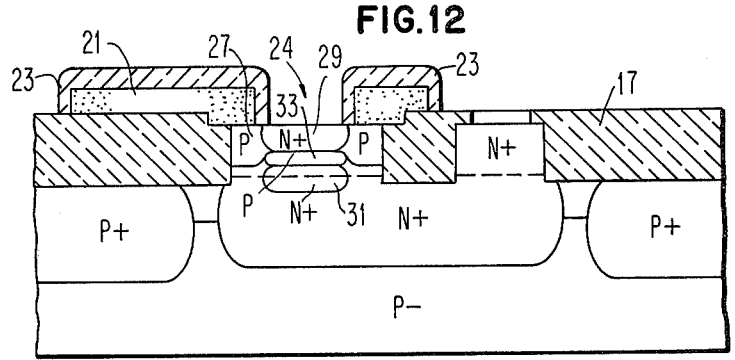

After the formation of silicon dioxide vertical sidewalls 26, the silicon dioxide layer at 25, as delineated by the vertical sidewalls 26, is removed. This is achieved by directional reactive ion etching techniques. Such techniques involve directing the ion beam at an angle normal to the surface of layer 25 and parallel to the surface of vertical sidewalls 26. This results in removing silicon dioxide layer 25 at the bottom of sidewalls 26, leaving silicon dioxide sidewalls 26 essentially unaffected, as shown in FIG. 12. It should be noted that although some etching of silicon dioxide layer 23 will occur, this layer is sufficiently thick as compared to silicon dioxide layer 25 that a residual layer is retained sufficient to act as a dielectric. In general, silicon dioxide layer 23 will be etched back to slightly less than the thickness that existed in this layer when it was formed in FIG. 10.

After removing silicon dioxide layer 25, the structure, as shown in FIG. 12, is ready for fabrication of the emitter, intrinsic base and raised subcollector regions through opening 24, whereby all these regions are aligned with respect to the polysilicon base contacts and sidewall silicon dioxide insulation. Although conventional diffusion may be employed for fabricating the emitter and intrinsic base regions, the preferred mode is to use ion implantation. For example, a relatively low-energy, high-dose arsenic ion implantation may be employed to fabricate shallow emitter region 29. Typically, the shallow emitter may be approximately 0.2 micrometers thick. Appropriate energy levels and heat cycling may be selected to achieve the desired emitter depth and thickness. Similarly, a relatively high-energy, high-dose phosphorus ion implantation may be used to fabricate the N+ raised subcollector 31, shown in FIG. 13. Typically, the buried, raised subcollector 31 may be approximately 0.2 micrometers thick. The energy and heat cycling conditions for the phosphorus implant are selected such that the bottom of the raised subcollector 31 nominally submerges into N+ subcollector region 5.

The purpose of the raised subcollector 31 is to minimize the series collector resistance in the "intrinsic" transistor region directly beneath the emitter, while, at the same time, minimizing collector-base junction capacitance under the extrinsic base regions.

Ion implantation was employed in FIG. 8 to form N+collector reachthrough region 18 and, in subsequent heat-treatment steps, the N+of region 18 diffused to meet N+region 5. In order to further minimize series resistance of the N+collector reachthrough region 18, the same may be further ion-implanted at the same time as ion implanting the emitter and raised subcollector. Preferably, before exercising these additional ion implants in the collector reachthrough region 18, the thin oxide layer over the reachthrough region is removed using a noncritical mask.

In addition to forming the emitter and raised subcollector regions, the intrinsic base region may, likewise, be formed via ion implantation through opening 24. To achieve this, boron may be ion-implanted at a medium energy level and of relatively low dosage. Again, with appropriate selection of energy levels and heat cycling, an intrinsic base region of appropriate thickness and depth may be realized.

It should be noted, that none of the ion implantation steps employed to fabricate the raised subcollector, intrinsic base and emitter regions need employ any masking techniques. In this regard, the thickness of silicon dioxide layer 23 covering polysilicon 21 is selected to prevent penetration of any implants into the polysilicon. Thus, the implants into the silicon occur precisely in the desired "intrinsic" transistor regions. It should be noted that the N+raised subcollector allows for any etching tolerance when polysilicon layer 21 is etched earlier. Thus, the impact of etching tolerance on device characteristics is minimized. It should also be noted that the heat cycling employed after the ion implants through window 24 also acts to further diffuse extrinsic base region 27 into epi layer 11. It is important, in this regard, that this latter diffusion be sufficient to enable good coupling between intrinsic base region 33 and the extrinsic base region 27.

Figure 14:
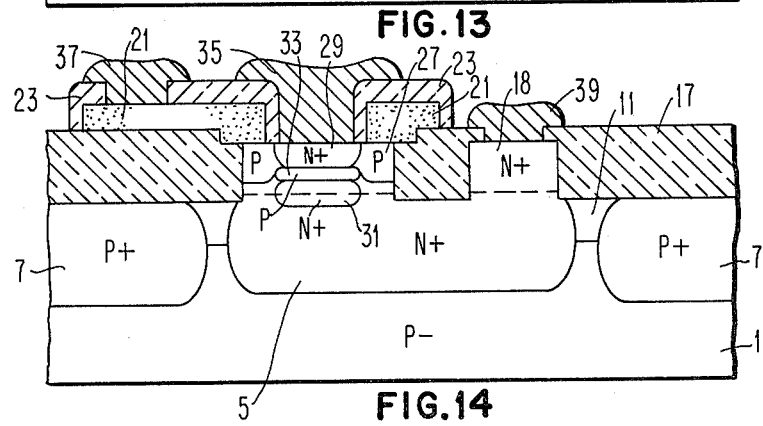

After the desired ion implants are made through window 24, the device is subjected to a suitable heat cycle. Then, conventional photolithography and etching techniques may be employed to open windows in silicon dioxide layer 23 covering the polysilicon whereby ohmic connection may be made. As shown in FIG. 14, ohmic connection is made to the emitter region, polysilicon base region and collector reach-through region via metal contacts 35, 37 and 39, respectively. It is clear that these metal contacts may be made through conventional photolithography and metallization techniques. To ensure metal film continuity, especially at emitter edges, without requiring excessive metal film thickness, the silicon dioxide covering the polysilicon may be partially etched back (e.g., approximately 2,000Å) through directional reactive ion etching of the silicon dioxide before metal deposition. In this case, the reactive ion etching conditions are adjusted so as to leave exposed silicon practically unaffected. In either event, the silicon dioxide covering the polysilicon sidewalls remains unaffected and acts to provide self-aligned, closely-spaced isolation between emitter opening and polysilicon base contacts.

While the invention has been particularly shown and described with reference to the preferred embodiment thereof, it will be understood by those skilled in the art that various changes in form and detail may be made therein without departing from the spirit and scope of the invention.

I claim:
1. A process for fabricating NPN bipolar transistors having a self-aligned polysilicon base contact in close-spaced relationship to the emitter contact therefor, comprising the following sequence of steps;
   forming a layer of P+doped polysilicon on a substrate at least a portion of which is an N-type silicon material;
   forming a layer of insulating material over said layer of P+doped polysilicon;
   etching said layer of insulating material and polysilicon down to said N-type material to form an opening therethrough;
   forming a thin layer of insulating material on said N-type material at the bottom of said opening and along the sidewalls of said polysilicon layer exposed by said opening;
   diffusing the P+doping material from said polysilicon layer into said N-type silicon material to form an extrinsic base region;
   etching by directional reactive ion etching the said thin layer of insulating material at the bottom of said opening as delineated by said sidewalls so as to remove the said insulating material at the bottom of said opening while leaving said insulating material on said sidewalls;
   forming through said opening with insulating sidewalls an intrinsic P-type base region therebelow; and
   forming through said opening with insulating sidewalls an N-type region above said intrinsic P-type base region, said N-type region forming a shallow N-type emitter.
2. The process as set forth in claim 1 wherein said insulating material is silicon dioxide formed by thermal oxidation.
3. The process as set forth in claim 2 wherein said N-type silicon material is an N−type epitaxial layer.
4. The process as set forth in claim 3 wherein said N-type emitter region is N+-type.
5. The process as set forth in claim 4 wherein the step of forming said shallow N+-type emitter region includes the step of forming said emitter region by ion implantation of arsenic.
6. The process as set forth in claim 5 wherein the step of forming said intrinsic P-type base region includes the step of forming said base region by ion implantation of boron.
7. The process as set forth in claim 4 including the step of forming an N-type raised subcollector region beneath said intrinsic P-type base region.
8. The process as set forth in claim 7 wherein said N-type raised subcollector region is N+-type.
9. The process as set forth in claim 8 wherein said N+-type raised subcollector region is formed by the step of ion implantation of phosphorus.
10. The process as set forth in claim 6 including the further step of forming an N+-type raised subcollector region beneath said intrinsic P-type base region by ion implantation of phosphorus.
11. A process for fabricating NPN bipolar transistors with a polysilicon base contact being in close-spaced and self-aligned relationship to the emitter contact therefore, comprising the following sequence of steps;
   forming an N+-type subcollector region in a P-type silicon substrate;
   forming an N-type epitaxial layer on at least said N+-type subcollector;

forming a layer of P+doped polysilicon on at least said N-type epitaxial layer;

forming a layer of insulating material over said layer of P+doped polysilicon;

etching said layer of insulating material and said polysilicon down to said N-type epitaxial layer to form an opening in said insulating material and said polysilicon;

forming a thin layer of insulating material on said epitaxial layer at the bottom of said opening and along the sidewalls of said polysilicon layer exposed by said opening while at the same time diffusing the said P+doping material from said polysilicon layer into said N-type epitaxial layer to form an extrinsic base region;

etching by directional reactive ion etching the said thin layer of insulating material at the bottom of said opening as delineated by said sidewalls so as to remove the said insulating material at the bottom of said opening while leaving said insulating material on said sidewalls;

forming through said opening with insulating sidewalls an intrinsic P-type base region therebelow; and forming through said opening with insulating sidewalls an N-type region above said P-type intrinsic base region, said N-type region forming a shallow N-type emitter.

12. The process as set forth in claim 11 wherein said insulating material is silicon dioxide.

13. The process as set forth in claim 12 wherein said silicon dioxide is formed by thermal oxidation.

14. The process as set forth in claim 13 wherein said P-type silicon substrate is P−type, and said N-type epitaxial layer is N−type.

15. The process as set forth in claim 14 wherein said N-type emitter region is N+-type.

16. The process as set forth in claim 15 wherein the step of forming said N+-type emitter region includes the step of forming an emitter region by ion implantation of arsenic.

17. The process as set forth in claim 16 wherein the step of forming said intrinsic P-type base region includes the step of forming a base region by ion implantation of boron.

18. The process as set forth in claim 15 including the further step of forming an N-type raised subcollector region beneath said P-type intrinsic base region and submerged partially into said N+-type subcollector region.

19. The process as set forth in claim 18 wherein said N-type raised subcollector region is N+-type.

20. The process as set forth in claim 19 wherein said N+-type raised subcollector region is formed by the step of ion implantation of phosphorus.

21. The process as set forth in claim 17 including the further step of forming an N+-type, raised subcollector region beneath said P-type intrinsic base region and submerged partially into said N+-type subcollector region by ion implantation of phosphorus.

22. A process for fabricating NPN bipolar transistors having a polysilicon base contact in close-spaced and self-aligned relationship to the emitter contact therefor, comprising the following sequence of steps;

forming an N+subcollector region in a P−silicon substrate;

forming an N−epitaxial layer on at least a portion of said N+subcollector region;

forming a layer of P+doped polysilicon on at least a portion of said N−epitaxial layer;

forming a layer of insulating material over said polysilicon;

etching said layer of insulating material and polysilicon down to said epitaxial layer to form an opening therethrough;

thermally forming a thin layer of insulating material on said epitaxial layer at the bottom of said opening and along the sidewalls of said polysilicon layer exposed by said opening to form an insulating material-coated opening while at the same time diffusing the said P+doping material from said polysilicon layer into said N−epitaxial layer to form an extrinsic base region;

etching by directional reactive ion etching the said thin layer of insulating material at the bottom of said opening as delineated by the sidewalls of said coated opening so as to remove said insulating material at the bottom of said opening while leaving it on said sidewalls;

forming through said coated opening a first N region therebelow using said coated polysilicon as a mask, said first N region forming a shallow N+emitter; and forming through said coated opening an intrinsic P-type base region beneath said N+emitter region using said coated polysilicon as a mask.

23. The process as set forth in claim 22 wherein said insulating material is silicon dioxide.

24. The process as set forth in claim 23 wherein said shallow N+emitter and intrinsic P-type base region are formed by ion implantation.

25. The process as set forth in claim 24 wherein said ion implantation includes ion implantation of arsenic and boron.

26. The process as set forth in claim 25 including the further step of ion implantation of phosphorus to form a raised subcollector region beneath said intrinsic P-type base region and submerged partially into said N+subcollector region.

* * * * *